(12) United States Patent
Foote et al.

(10) Patent No.: US 7,678,667 B2
(45) Date of Patent: Mar. 16, 2010

(54) METHOD OF BONDING MEMS INTEGRATED CIRCUITS

(75) Inventors: Roger Mervyn Lloyd Foote, Balmain (AU); Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 212 days.

(21) Appl. No.: 11/766,052

(22) Filed: Jun. 20, 2007

(65) Prior Publication Data

US 2008/0318352 A1    Dec. 25, 2008

(51) Int. Cl.
*H01L 21/30* (2006.01)
*H01L 21/46* (2006.01)

(52) U.S. Cl. .......................... 438/455; 438/21; 438/25; 438/26; 438/51; 438/55; 257/E21.499

(58) Field of Classification Search .................. 438/21, 438/25, 26, 51, 55, 106, 455, 459; 257/676, 257/678, 711, 787, E21.499; 156/60, 230, 156/249, 153, 154
See application file for complete search history.

(56) References Cited

U.S. PATENT DOCUMENTS

| | | | | |
|---|---|---|---|---|
| 5,476,566 A | * | 12/1995 | Cavasin | 156/249 |
| 6,425,971 B1 | * | 7/2002 | Silverbrook | 156/230 |
| 2008/0242052 A1 | * | 10/2008 | Feng et al. | 438/459 |

* cited by examiner

*Primary Examiner*—Charles D Garber
*Assistant Examiner*—Abdulfattah Mustapha

(57) ABSTRACT

A method of bonding an integrated circuit to a substrate is provided. The integrated circuit is one of a plurality of integrated circuits, each having a respective frontside releasably attached to a film frame tape supported by a wafer film frame. The method comprises the steps of: (a) positioning a substrate at a backside of the integrated circuit; (c) positioning a bonding tool on a zone of the film frame tape, the zone being aligned with the integrated circuit; and (c) applying a bonding force from the bonding tool, through the film frame tape and the integrated circuit, onto the substrate.

20 Claims, 11 Drawing Sheets

METHOD OF BONDING MEMS INTEGRATED CIRCUITS

FIELD OF THE INVENTION

The present invention relates to the fabrication and bonding of MEMS integrated circuits. It has been developed primarily to facilitate construction of printheads from a plurality of such printhead integrated circuits.

CROSS REFERENCE TO RELATED APPLICATIONS

The following patents or patent applications filed by the applicant or assignee of the present invention are hereby incorporated by cross-reference.

| | | | | |
|---|---|---|---|---|
| 6,405,055 | 6,628,430 | 7,136,186 | 10/920,372 | 7,145,689 |
| 7,130,075 | 7,081,974 | 7,177,055 | 7,209,257 | 7,161,715 |
| 7,154,632 | 7,158,258 | 7,148,993 | 7,075,684 | 11/635,526 |
| 11/650,545 | 11/653,241 | 11/653,240 | 11/758,648 | 10/503,924 |
| 7,108,437 | 6,915,140 | 6,999,206 | 7,136,198 | 7,092,130 |
| 09/517,539 | 6,566,858 | 6,331,946 | 6,246,970 | 6,442,525 |
| 09/517,384 | 09/505,951 | 6,374,354 | 09/517,608 | 6,816,968 |
| 6,757,832 | 6,334,190 | 6,745,331 | 09/517,541 | 10/203,559 |
| 7,197,642 | 7,093,139 | 10/636,263 | 10/636,283 | 10/866,608 |
| 7,210,038 | 10/902,833 | 10/940,653 | 10/942,858 | 11/706,329 |
| 11/757,385 | 11/758,642 | 7,170,652 | 6,967,750 | 6,995,876 |
| 7,099,051 | 11/107,942 | 7,193,734 | 11/209,711 | 11/599,336 |
| 7,095,533 | 6,914,686 | 7,161,709 | 7,099,033 | 11/003,786 |
| 11/003,616 | 11/003,418 | 11/003,334 | 11/003,600 | 11/003,404 |
| 11/003,419 | 11/003,700 | 11/003,601 | 11/003,618 | 7,229,148 |
| 11/003,337 | 11/003,698 | 11/003,420 | 6,984,017 | 11/003,699 |
| 11/071,473 | 11/748,482 | 11/003,463 | 11/003,701 | 11/003,683 |
| 11/003,614 | 11/003,702 | 11/003,684 | 11/003,619 | 11/003,617 |
| 11/764,760 | 11/293,800 | 11/293,802 | 11/293,801 | 11/293,808 |
| 11/293,809 | 11/482,975 | 11/482,970 | 11/482,968 | 11/482,972 |
| 11/482,971 | 11/482,969 | 11/097,266 | 11/097,267 | 11/685,084 |
| 11/685,086 | 11/685,090 | 11/740,925 | 11/763,444 | 11/763,443 |
| 11/518,238 | 11/518,280 | 11/518,244 | 11/518,243 | 11/518,242 |
| 11/084,237 | 11/084,240 | 11/084,238 | 11/357,296 | 11/357,298 |
| 11/357,297 | 11/246,676 | 11/246,677 | 11/246,678 | 11/246,679 |
| 11/246,680 | 11/246,681 | 11/246,714 | 11/246,713 | 11/246,689 |
| 11/246,671 | 11/246,670 | 11/246,669 | 11/246,704 | 11/246,710 |
| 11/246,688 | 11/246,716 | 11/246,715 | 11/246,707 | 11/246,706 |
| 11/246,705 | 11/246,708 | 11/246,693 | 11/246,692 | 11/246,696 |
| 11/246,695 | 11/246,694 | 11/482,958 | 11/482,955 | 11/482,962 |
| 11/482,963 | 11/482,956 | 11/482,954 | 11/482,974 | 11/482,957 |
| 11/482,987 | 11/482,959 | 11/482,960 | 11/482,961 | 11/482,964 |
| 11/482,965 | 11/482,976 | 11/482,973 | 11/495,815 | 11/495,816 |
| 11/495,817 | 6,227,652 | 6,213,588 | 6,213,589 | 6,231,163 |
| 6,247,795 | 6,394,581 | 6,244,691 | 6,257,704 | 6,416,168 |
| 6,220,694 | 6,257,705 | 6,247,794 | 6,234,610 | 6,247,793 |
| 6,264,306 | 6,241,342 | 6,247,792 | 6,264,307 | 6,254,220 |
| 6,234,611 | 6,302,528 | 6,283,582 | 6,239,821 | 6,338,547 |
| 6,247,796 | 6,557,977 | 6,390,603 | 6,362,843 | 6,293,653 |
| 6,312,107 | 6,227,653 | 6,234,609 | 6,238,040 | 6,188,415 |
| 6,227,654 | 6,209,989 | 6,247,791 | 6,336,710 | 6,217,153 |
| 6,416,167 | 6,243,113 | 6,283,581 | 6,247,790 | 6,260,953 |
| 6,267,469 | 6,588,882 | 6,742,873 | 6,918,655 | 6,547,371 |
| 6,938,989 | 6,598,964 | 6,923,526 | 6,273,544 | 6,309,048 |
| 6,420,196 | 6,443,558 | 6,439,689 | 6,378,989 | 6,848,181 |
| 6,634,735 | 6,299,289 | 6,299,290 | 6,425,654 | 6,902,255 |
| 6,623,101 | 6,406,129 | 6,505,916 | 6,457,809 | 6,550,895 |
| 6,457,812 | 7,152,962 | 6,428,133 | 7,216,956 | 7,080,895 |
| 11/144,844 | 7,182,437 | 11/599,341 | 11/635,533 | 11/607,976 |
| 11/607,975 | 11/607,999 | 11/607,980 | 11/607,979 | 11/607,978 |
| 11/735,961 | 11/685,074 | 11/696,126 | 11/696,144 | 11/696,650 |
| 11/763,446 | 10/407,212 | 10/407,207 | 10/683,064 | 10/683,041 |
| 11/482,980 | 11/563,684 | 11/482,967 | 11/482,966 | 11/482,988 |
| 11/482,989 | 11/293,832 | 11/293,838 | 11/293,825 | 11/293,841 |
| 11/293,799 | 11/293,796 | 11/293,797 | 11/293,798 | 11/124,158 |
| 11/124,196 | 11/124,199 | 11/124,162 | 11/124,202 | 11/124,197 |
| 11/124,154 | 11/124,198 | 11/124,153 | 11/124,151 | 11/124,160 |
| 11/124,192 | 11/124,175 | 11/124,163 | 11/124,149 | 11/124,152 |
| 11/124,173 | 11/124,155 | 11/124,157 | 11/124,174 | 11/124,194 |

-continued

| | | | | |
|---|---|---|---|---|
| 11/124,164 | 11/124,200 | 11/124,195 | 11/124,166 | 11/124,150 |
| 11/124,172 | 11/124,165 | 11/124,186 | 11/124,185 | 11/124,184 |
| 11/124,182 | 11/124,201 | 11/124,171 | 11/124,181 | 11/124,161 |
| 11/124,156 | 11/124,191 | 11/124,159 | 11/124,176 | 11/124,188 |
| 11/124,170 | 11/124,187 | 11/124,189 | 11/124,190 | 11/124,180 |
| 11/124,193 | 11/124,183 | 11/124,178 | 11/124,177 | 11/124,148 |
| 11/124,168 | 11/124,167 | 11/124,179 | 11/124,169 | 11/187,976 |
| 11/188,011 | 11/188,014 | 11/482,979 | 11/735,490 | 11/228,540 |
| 11/228,500 | 11/228,501 | 11/228,530 | 11/228,490 | 11/228,531 |
| 11/228,504 | 11/228,533 | 11/228,502 | 11/228,507 | 11/228,482 |
| 11/228,505 | 11/228,497 | 11/228,487 | 11/228,529 | 11/228,484 |
| 11/228,489 | 11/228,518 | 11/228,536 | 11/228,496 | 11/228,488 |
| 11/228,506 | 11/228,516 | 11/228,526 | 11/228,539 | 11/228,538 |
| 11/228,524 | 11/228,523 | 11/228,519 | 11/228,528 | 11/228,527 |
| 11/228,525 | 11/228,520 | 11/228,498 | 11/228,511 | 11/228,522 |
| 111/228,515 | 11/228,537 | 11/228,534 | 11/228,491 | 11/228,499 |
| 11/228,509 | 11/228,492 | 11/228,493 | 11/228,510 | 11/228,508 |
| 11/228,512 | 11/228,514 | 11/228,494 | 11/228,495 | 11/228,486 |
| 11/228,481 | 11/228,477 | 11/228,485 | 11/228,483 | 11/228,521 |
| 11/228,517 | 11/228,532 | 11/228,513 | 11/228,503 | 11/228,480 |
| 11/228,535 | 11/228,478 | 11/228,479 | 6,087,638 | 6,340,222 |
| 6,041,600 | 6,299,300 | 6,067,797 | 6,286,935 | 6,044,646 |
| 6,382,769 | 10/868,866 | 6,787,051 | 6,938,990 | 11/242,916 |
| 11/242,917 | 11/144,799 | 11/198,235 | 7,152,972 | 11/592,996 |
| 6,746,105 | 11/763,440 | 11/763,442 | 11/246,687 | 11/246,718 |
| 11/246,685 | 11/246,686 | 11/246,703 | 11/246,691 | 11/246,711 |
| 11/246,690 | 11/246,712 | 11/246,717 | 11/246,709 | 11/246,700 |
| 11/246,701 | 11/246,702 | 11/246,668 | 11/246,697 | 11/246,698 |
| 11/246,699 | 11/246,675 | 11/246,674 | 11/246,667 | 7,156,508 |
| 7,159,972 | 7,083,271 | 7,165,834 | 7,080,894 | 7,201,469 |
| 7,090,336 | 7,156,489 | 10/760,233 | 10/760,246 | 7,083,257 |
| 10/760,243 | 10/760,201 | 7,219,980 | 10/760,253 | 10/760,255 |
| 10/760,209 | 7,118,192 | 10/760,194 | 10/760,238 | 7,077,505 |
| 7,198,354 | 7,077,504 | 10/760,189 | 7,198,355 | 10/760,232 |
| 10/760,231 | 7,152,959 | 7,213,906 | 7,178,901 | 7,222,938 |
| 7,108,353 | 7,104,629 | 11/446,227 | 11/454,904 | 11/472,345 |
| 11/474,273 | 11/478,594 | 11/474,279 | 11/482,939 | 11/482,950 |
| 11/499,709 | 11/592,984 | 11/601,668 | 11/603,824 | 11/601,756 |
| 11/601,672 | 11/650,546 | 11/653,253 | 11/706,328 | 11/706,299 |
| 11/706,965 | 11/737,080 | 11/737,041 | 11/246,684 | 11/246,672 |
| 11/246,673 | 11/246,683 | 11/246,682 | 60/939086 | 10/728,804 |
| 7,128,400 | 7,108,355 | 6,991,322 | 10/728,790 | 7,118,197 |
| 10/728,970 | 10/728,784 | 10/728,783 | 7,077,493 | 6,962,402 |
| 10/728,803 | 7,147,308 | 10/728,779 | 7,118,198 | 7,168,790 |
| 7,172,270 | 7,229,155 | 6,830,318 | 7,195,342 | 7,175,261 |
| 10/773,183 | 7,108,356 | 7,118,202 | 10/773,186 | 7,134,744 |
| 10/773,185 | 7,134,743 | 7,182,439 | 7,210,768 | 10/773,187 |
| 7,134,745 | 7,156,484 | 7,118,201 | 7,111,926 | 10/773,184 |
| 7,018,021 | 11/060,751 | 11/060,805 | 11/188,017 | 7,128,402 |
| 11/298,774 | 11/329,157 | 11/490,041 | 11/501,767 | 11/499,736 |
| 11/505,935 | 7,229,156 | 11/505,846 | 11/505,857 | 11/505,856 |
| 11/524,908 | 11/524,938 | 11/524,900 | 11/524,912 | 11/592,999 |
| 11/592,995 | 11/603,825 | 11/649,773 | 11/650,549 | 11/653,237 |
| 11/706,374 | 11/706,962 | 11/749,118 | 11/754,937 | 11/749,120 |
| 11/744,885 | 11/765,439 | 11/097,308 | 11/097,309 | 11/097,335 |
| 11/097,299 | 11/097,310 | 11/097,213 | 11/210,687 | 11/097,212 |
| 7,147,306 | 11/545,509 | 11/764,806 | 11/482,953 | 11/482,977 |
| 11/544,778 | 11/544,779 | 11/764,808 | 11/066,161 | 11/066,160 |
| 11/066,159 | 11/066,158 | 11/066,165 | 10/727,181 | 10/727,162 |
| 10/727,163 | 10/727,245 | 7,121,639 | 7,165,824 | 7,152,942 |
| 10/727,157 | 7,181,572 | 7,096,137 | 10/727,257 | 10/727,238 |
| 7,188,282 | 10/727,159 | 10/727,180 | 10/727,179 | 10/727,192 |
| 10/727,274 | 10/727,164 | 10/727,161 | 10/727,198 | 10/727,158 |
| 10/754,536 | 10/754,938 | 10/727,227 | 10/727,160 | 10/934,720 |
| 7,171,323 | 11/272,491 | 11/474,278 | 11/488,853 | 11/488,841 |
| 11/749,750 | 11/749,749 | 10/296,522 | 6,795,215 | 7,070,098 |
| 7,154,638 | 6,805,419 | 6,859,289 | 6,977,751 | 6,398,332 |
| 6,394,573 | 6,622,923 | 6,747,760 | 6,921,144 | 10/884,881 |
| 7,092,112 | 7,192,106 | 11/039,866 | 7,173,739 | 6,986,560 |
| 7,008,033 | 11/148,237 | 7,222,780 | 11/248,426 | 11/478,599 |
| 11/499,749 | 11/738,518 | 11/482,981 | 11/743,661 | 11/743,659 |
| 11/752,900 | 7,195,328 | 7,182,422 | 11/650,537 | 11/712,540 |
| 10/854,521 | 10/854,522 | 10/854,488 | 10/854,487 | 10/854,503 |
| 10/854,504 | 10/854,509 | 7,188,928 | 7,093,989 | 10/854,497 |
| 10/854,495 | 10/854,498 | 10/854,511 | 10/854,512 | 10/854,525 |
| 10/854,526 | 10/854,516 | 10/854,508 | 10/854,507 | 10/854,515 |
| 10/854,506 | 10/854,505 | 10/854,493 | 10/854,494 | 10/854,489 |
| 10/854,490 | 10/854,492 | 10/854,491 | 10/854,528 | 10/854,523 |
| 10/854,527 | 10/854,524 | 10/854,520 | 10/854,514 | 10/854,519 |

-continued

| | | | | |
|---|---|---|---|---|
| 10/854,513 | 10/854,499 | 10/854,501 | 10/854,500 | 10/854,502 |
| 10/854,518 | 10/854,517 | 10/934,628 | 7,163,345 | 11/499,803 |
| 11/601,757 | 11/706,295 | 11/735,881 | 11/748,483 | 11/749,123 |
| 11/014,731 | 11/544,764 | 11/544,765 | 11/544,772 | 11/544,773 |
| 11/544,774 | 11/544,775 | 11/544,776 | 11/544,766 | 11/544,767 |
| 11/544,771 | 11/544,770 | 11/544,769 | 11/544,777 | 11/544,768 |
| 11/544,763 | 11/293,804 | 11/293,840 | 11/293,803 | 11/293,833 |
| 11/293,834 | 11/293,835 | 11/293,836 | 11/293,837 | 11/293,792 |
| 11/293,794 | 11/293,839 | 11/293,826 | 11/293,829 | 11/293,830 |
| 11/293,827 | 11/293,828 | 11/293,795 | 11/293,823 | 11/293,824 |
| 11/293,831 | 11/293,815 | 11/293,819 | 11/293,818 | 11/293,817 |
| 11/293,816 | 11/482,978 | 11/640,356 | 11/640,357 | 11/640,358 |
| 11/640,359 | 11/640,360 | 11/640,355 | 11/679,786 | 10/760,254 |
| 10/760,210 | 10/760,202 | 7,201,468 | 10/760,198 | 10/760,249 |
| 10/760,263 | 10/760,196 | 10/760,247 | 7,156,511 | 10/760,264 |
| 10/760,244 | 7,097,291 | 10/760,222 | 10/760,248 | 7,083,273 |
| 10/760,192 | 10/760,203 | 10/760,204 | 10/760,205 | 10/760,206 |
| 10/760,267 | 10/760,270 | 7,198,352 | 10/760,271 | 10/760,275 |
| 7,201,470 | 7,121,655 | 10/760,184 | 7,232,208 | 10/760,186 |
| 10/760,261 | 7,083,272 | 11/501,771 | 11/583,874 | 11/650,554 |
| 11/706,322 | 11/706,968 | 11/749,119 | 11/014,764 | 11/014,763 |
| 11/014,748 | 11/014,747 | 11/014,761 | 11/014,760 | 11/014,757 |
| 11/014,714 | 11/014,713 | 11/014,762 | 11/014,724 | 11/014,723 |
| 11/014,756 | 11/014,736 | 11/014,759 | 11/014,758 | 11/014,725 |
| 11/014,739 | 11/014,738 | 11/014,737 | 11/014,726 | 11/014,745 |
| 11/014,712 | 11/014,715 | 11/014,751 | 11/014,735 | 11/014,734 |
| 11/014,719 | 11/014,750 | 11/014,749 | 11/014,746 | 11/758,640 |
| 11/014,769 | 11/014,729 | 11/014,743 | 11/014,733 | 11/014,754 |
| 11/014,755 | 11/014,765 | 11/014,766 | 11/014,740 | 11/014,720 |
| 11/014,753 | 11/014,752 | 11/014,744 | 11/014,741 | 11/014,768 |
| 11/014,767 | 11/014,718 | 11/014,717 | 11/014,716 | 11/014,732 |
| 11/014,742 | 11/097,268 | 11/097,185 | 11/097,184 | 11/293,820 |
| 11/293,813 | 11/293,822 | 11/293,812 | 11/293,821 | 11/293,814 |
| 11/293,793 | 11/293,842 | 11/293,811 | 11/293,807 | 11/293,806 |
| 11/293,805 | 11/293,810 | 11/688,863 | 11/688,864 | 11/688,865 |
| 11/688,866 | 11/688,867 | 11/688,868 | 11/688,869 | 11/688,871 |
| 11/688,872 | 11/688,873 | 11/741,766 | 11/482,982 | 11/482,983 |
| 11/482,984 | 11/495,818 | 11/495,819 | 11/677,049 | 11/677,050 |
| 11/677,051 | 11/014,722 | 10/760,180 | 7,111,935 | 10/760,213 |
| 10/760,219 | 10/760,237 | 10/760,221 | 10/760,220 | 7,002,664 |
| 10/760,252 | 10/760,265 | 7,088,420 | 11/446,233 | 11/503,083 |
| 11/503,081 | 11/516,487 | 11/599,312 | 11/014,728 | 11/014,727 |
| 10/760,230 | 7,168,654 | 7,201,272 | 6,991,098 | 7,217,051 |
| 6,944,970 | 10/760,215 | 7,108,434 | 10/760,257 | 7,210,407 |
| 7,186,042 | 10/760,266 | 6,920,704 | 7,217,049 | 10/760,214 |
| 10/760,260 | 7,147,102 | 10/760,269 | 10/760,199 | 10/760,241 |
| 10/962,413 | 10/962,427 | 10/962,418 | 10/962,511 | 10/962,402 |
| 10/962,425 | 10/962,428 | 7,191,978 | 10/962,426 | 10/962,409 |
| 10/962,417 | 10/962,403 | 7,163,287 | 10/962,522 | 10/962,523 |
| 10/962,524 | 10/962,410 | 7,195,412 | 7,207,670 | 11/282,768 |
| 7,220,072 | 11/474,267 | 11/544,547 | 11/585,925 | 11/593,000 |
| 11/706,298 | 11/706,296 | 11/706,327 | 11/730,760 | 11/730,407 |
| 11/730,787 | 11/735,977 | 11/736,527 | 11/753,566 | 11/754,359 |
| 11/765,398 | 11/223,262 | 11/223,018 | 11/223,114 | 11/223,022 |
| 11/223,021 | 11/223,020 | 11/223,019 | 11/014,730 | 7,079,292 |
| 09/575,197 | 7,079,712 | 09/575,123 | 6,825,945 | 09/575,165 |
| 6,813,039 | 6,987,506 | 7,038,797 | 6,980,318 | 6,816,274 |
| 7,102,772 | 09/575,186 | 6,681,045 | 6,728,000 | 7,173,722 |
| 7,088,459 | 09/575,181 | 7,068,382 | 7,062,651 | 6,789,194 |
| 6,789,191 | 6,644,642 | 6,502,614 | 6,622,999 | 6,669,385 |
| 6,549,935 | 6,987,573 | 6,727,996 | 6,591,884 | 6,439,706 |
| 6,760,119 | 09/575,198 | 6,290,349 | 6,428,155 | 6,785,016 |
| 6,870,966 | 6,822,639 | 6,737,591 | 7,055,739 | 09/575,129 |
| 6,830,196 | 6,832,717 | 6,957,768 | 09/575,172 | 7,170,499 |
| 7,106,888 | 7,123,239 | | | |

BACKGROUND OF THE INVENTION

The present Applicant has described previously how a pagewidth inkjet printhead may be constructed from a plurality of abutting printhead integrated circuits (also known as printhead ICs, printhead chips and printhead dies). As described extensively in, for example, Applicant's U.S. application Ser. No. 11/014,732 filed on Dec. 12, 2004 (the contents of which is herein incorporated by reference), a pagewidth printhead usually comprises a plurality of abutting printhead ICs attached to a liquid crystal polymer (LCP) ink manifold via an adhesive intermediary layer, which is sandwiched between the LCP ink manifold and the printhead ICs. The adhesive intermediary layer is typically a laser-drilled epoxy-coated polymer film.

The construction of such printheads presents a number of design challenges. Firstly, the printhead ICs must be mounted with high precision on the polymer film so that laser-drilled holes in the film are aligned with backside ink supply channels in the printhead ICs. Secondly, the MEMS fabrication process for the printhead ICs should preferably present the ICs in such a way that facilitates bonding onto the intermediary layer.

Hitherto, the Applicant has described how backside MEMS processing of a printhead wafer may be performed to provide individual printhead ICs (see, for example, U.S. Pat. No. 6,846,692, the contents of which is incorporated herein by reference). During backside MEMS processing, the backside of the wafer is ground to a desired wafer thickness (typically 100 to 300 microns) and ink supply channels are etched from a backside of the wafer so as to form a fluidic connection between the backside, which receives ink, and nozzle assemblies on a frontside of the wafer. In addition, backside MEMS processing defines dicing streets in the wafer so that the wafer can be separated into the individual printhead ICs. Finally, any photoresist in the wafer is ashed off using an oxidative plasma. The exact ordering of backside MEMS processing steps may be varied, although backside MEMS processing is typically performed after completion of all frontside MEMS fabrication steps, in which the nozzle assemblies are constructed on the frontside of the wafer.

In the process described in U.S. Pat. No. 6,846,692, the individual printhead ICs end up mounted, via their backsides, to a handling means. The handling means may be a glass handle wafer, with the printhead ICs attached thereto via a releasable adhesive tape e.g. UV-release tape or thermal-release tape. Alternatively, the handling means may be a wafer film frame, with the printhead ICs being attached to a dicing tape supported by the wafer film frame. Wafer film frame arrangements will be well known to the person skilled in the art.

The printhead ICs may be picked off individually from the handling means (for, example, using a robot) and either packaged or bonded directly to an intermediary substrate to construct a printhead. U.S. Pat. No. 6,946,692 describes how a vacuum pick-up may be used in combination with a reciprocating x-y wafer stage and a UV lamp/mask to remove individual printhead ICs from a glass handle wafer.

However, a problem with the process described in U.S. Pat. No. 6,846,692 is that the individual printhead ICs must be removed from the handling means and then aligned and bonded with high accuracy to the intermediary substrate. Whilst robot handling of the ICs helps to improve alignment accuracies, there are inevitable alignment losses in such a process.

It would be desirable to provide a process for removing MEMS devices, such as printhead ICs, from a handling means, which facilitates alignment of the devices when bonded to a further substrate, such the intermediary substrate described above.

It would be further desirable to provide a process for printhead construction, which facilitates the use of alternative non-polymeric intermediary substrates. Polymeric adhesive layers are inexpensive and convenient to handle, but suffer from comparatively high thermal expansion relative to the silicon printhead ICs and the LCP ink supply manifold. A comparatively high coefficient of thermal expansion for the intermediary substrate exacerbates alignment problems during construction and may even lead to loss of alignment over the duration of the printhead lifetime.

SUMMARY OF THE INVENTION

In a first aspect the present invention provides a method of bonding an integrated circuit to a substrate, said integrated circuit being one of a plurality of integrated circuits each having a respective frontside releasably attached to a film frame tape supported by a wafer film frame, said method comprising the steps of:
(a) positioning a substrate at a backside of said integrated circuit;
(c) positioning a bonding tool on a zone of said film frame tape, said zone being aligned with said integrated circuit; and
(c) applying a bonding force from said bonding tool, through said film frame tape and said integrated circuit, onto said substrate, thereby bonding said backside of said integrated circuit to said substrate.

In a further aspect there is provided a method, further comprising the step of:
removing said bonding tool from said tape.

Optionally, said film frame tape is a UV-release tape.

In a further aspect there is provided a method, further comprising the step of:
exposing said zone of said film frame tape to UV radiation and releasing said bonded integrated circuit from said tape.

Optionally, said integrated circuit is a MEMS integrated circuit.

Optionally, said integrated circuit is a printhead integrated circuit.

Optionally, steps (a) to (c) are repeated so as to construct a printhead on said substrate, said printhead comprising a plurality of abutting printhead integrated circuits.

Optionally, said substrate has a plurality of ink supply holes defined therein, wherein one or more of said holes are aligned with ink supply channels defined in the backside of said printhead integrated circuit.

Optionally, said substrate is an intermediary substrate for attachment of said printhead integrated circuit to an ink supply manifold.

Optionally, said intermediary substrate is an adhesive polymer film.

Optionally, said intermediary substrate is a rigid member having a coefficient of thermal expansion within about 20% of the coefficient of thermal expansion of the printhead integrated circuit and/or the ink supply manifold.

Optionally, said intermediary substrate is a glass member.

Optionally, a backside of each of the plurality of integrated circuits is pre-treated for bonding to said intermediary substrate.

Optionally, said backside comprises an oxide layer.

Optionally, said oxide layer is pre-treated with liquid ammonia.

In a second aspect the present invention provides a method of constructing a printhead using a plurality of printhead integrated circuits, each of said printhead integrated circuits having a respective frontside releasably attached to a film frame tape supported by a wafer film frame, said method comprising the steps of:
(a) positioning a substrate at a backside of one of said printhead integrated circuits;
(c) positioning a bonding tool on a zone of said film frame tape, said zone being aligned with said printhead integrated circuit;
(c) applying a bonding force from said bonding tool, through said film frame tape and said printhead integrated circuit, onto said substrate, thereby bonding said backside of said printhead integrated circuit to said substrate;
(d) repeating steps (a) to (c) so as to construct a printhead on said substrate, wherein said printhead comprises a predetermined number of abutting printhead integrated circuits.

Optionally, said substrate comprises a plurality of ink supply holes defined therein, each of said holes being aligned with an ink supply channel defined in the backside of said printhead.

Optionally, said substrate is a glass member.

In a further aspect there is provided a method, further comprising the step of:
bonding said substrate to an ink supply manifold such that said substrate is sandwiched between said printhead and said ink supply manifold.

Optionally, said printhead is a pagewidth inkjet printhead.

BRIEF DESCRIPTION OF THE DRAWINGS

Optional embodiments of the present invention will now be described by way of example only with reference to the accompanying drawings, in which.

DESCRIPTION OF OPTIONAL EMBODIMENTS

Printhead Assembly

Figure 1:
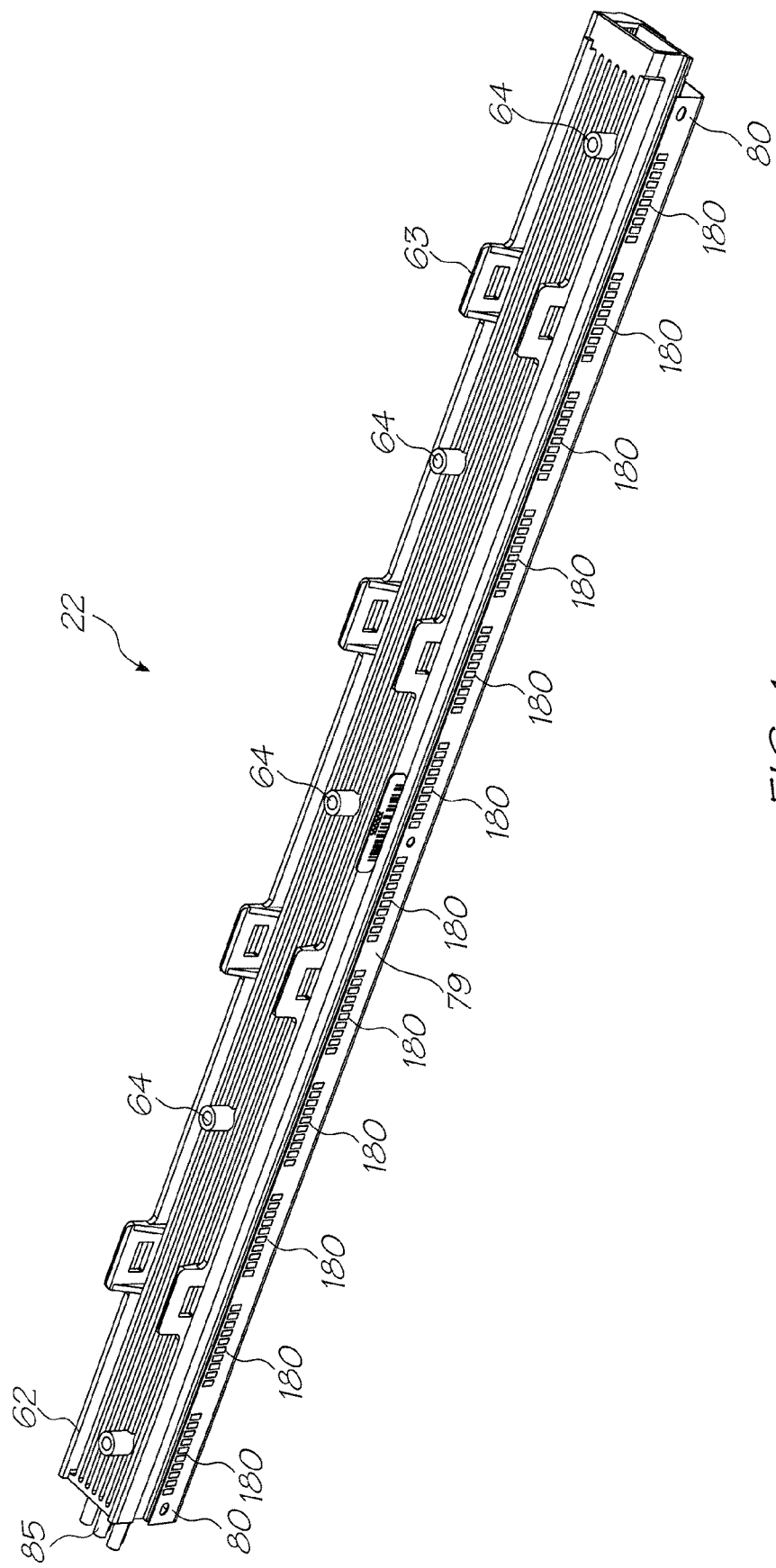
FIG. 1 is a front perspective view of a printhead assembly.

A constructed printhead assembly 22 for a pagewidth printer (not shown) is shown in FIGS. 1 to 4. The printhead assembly 22 generally comprises an elongate upper member 62 having a plurality of projecting U-shaped clips 63. These clips 63 are captured by lugs (not shown) formed in a main body (not shown) of the printer to secure the printhead assembly 22 thereto.

The upper element 62 has a plurality of feed tubes 64 that receive ink from ink reservoirs (not shown) in the printer. The feed tubes 64 may be provided with an outer coating to guard against ink leakage.

The upper member 62 is made from a liquid crystal polymer (LCP) which offers a number of advantages. It can be molded so that its coefficient of thermal expansion (CTE) is similar to that of silicon. It will be appreciated that any significant difference in the CTE's of the printhead integrated circuit 74 (discussed below) and the underlying moldings can cause the entire structure to bow. LCP also has a relatively high stiffness with a modulus that is typically 5 times that of 'normal plastics' such as polycarbonates, styrene, nylon, PET and polypropylene.

Figure 2:
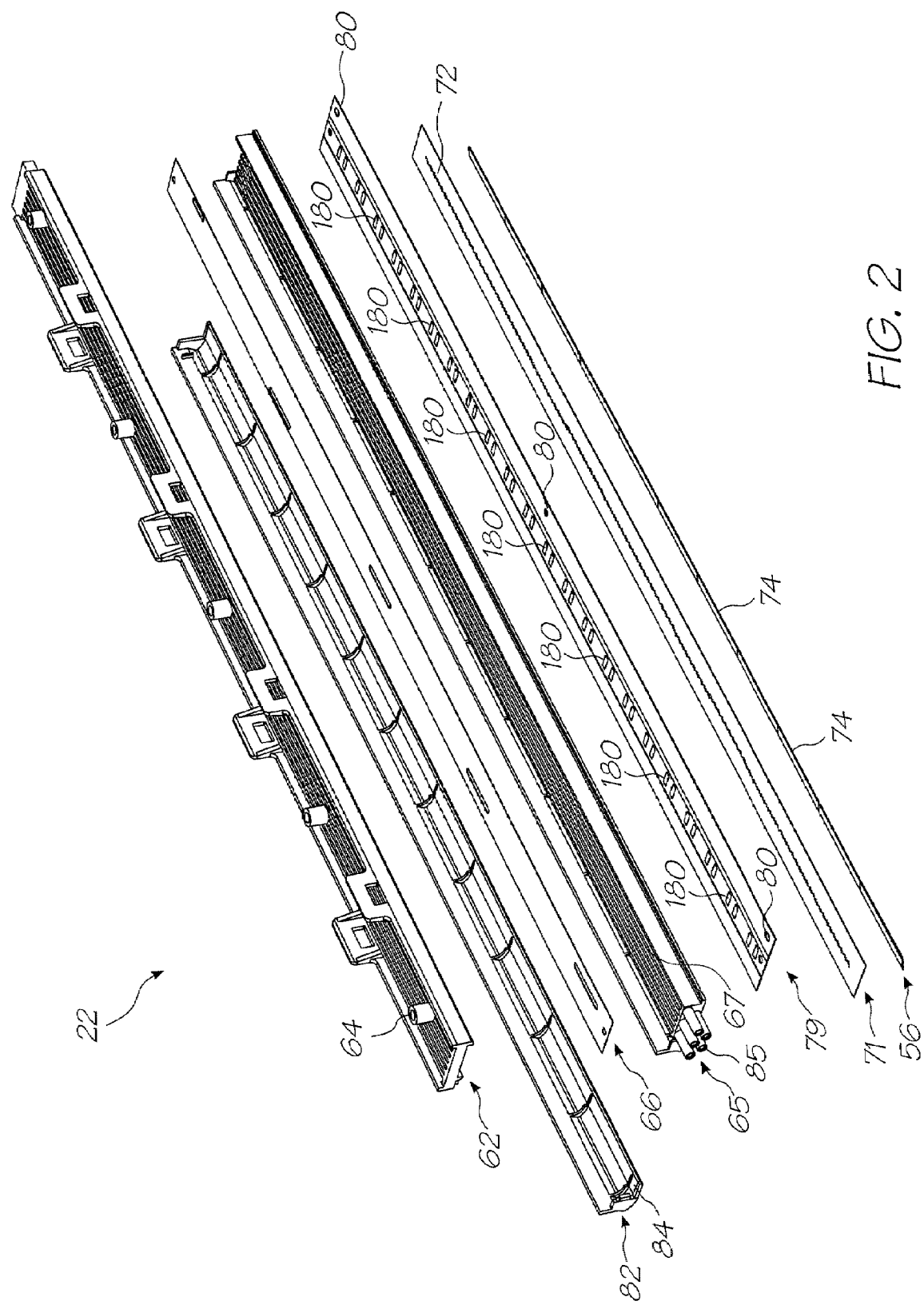
FIG. 2 is an exploded front perspective view the printhead assembly shown in FIG. 1.

As best shown in FIG. 2, upper member 62 has an open channel configuration for receiving a lower member 65, which is bonded thereto, via an adhesive film 66. The lower member 65 is also made from an LCP and has a plurality of ink channels 67 formed along its length. Each of the ink channels 67 receives ink from one of the feed tubes 64, and distributes the ink along the length of the printhead assembly 22. The channels are 1 mm wide and separated by 0.75 mm thick walls.

In the embodiment shown, the lower member 65 has five channels 67 extending along its length. Each channel 67 receives ink from only one of the five feed tubes 64.

In the bottom of each channel 67 are a series of equi-spaced holes 69 (best seen in FIG. 3) to give five rows of holes 69 in the bottom surface of the lower member 65. The middle row of holes 69 extends along the centre-line of the lower member 65, directly above the printhead IC 74.

Figure 3:
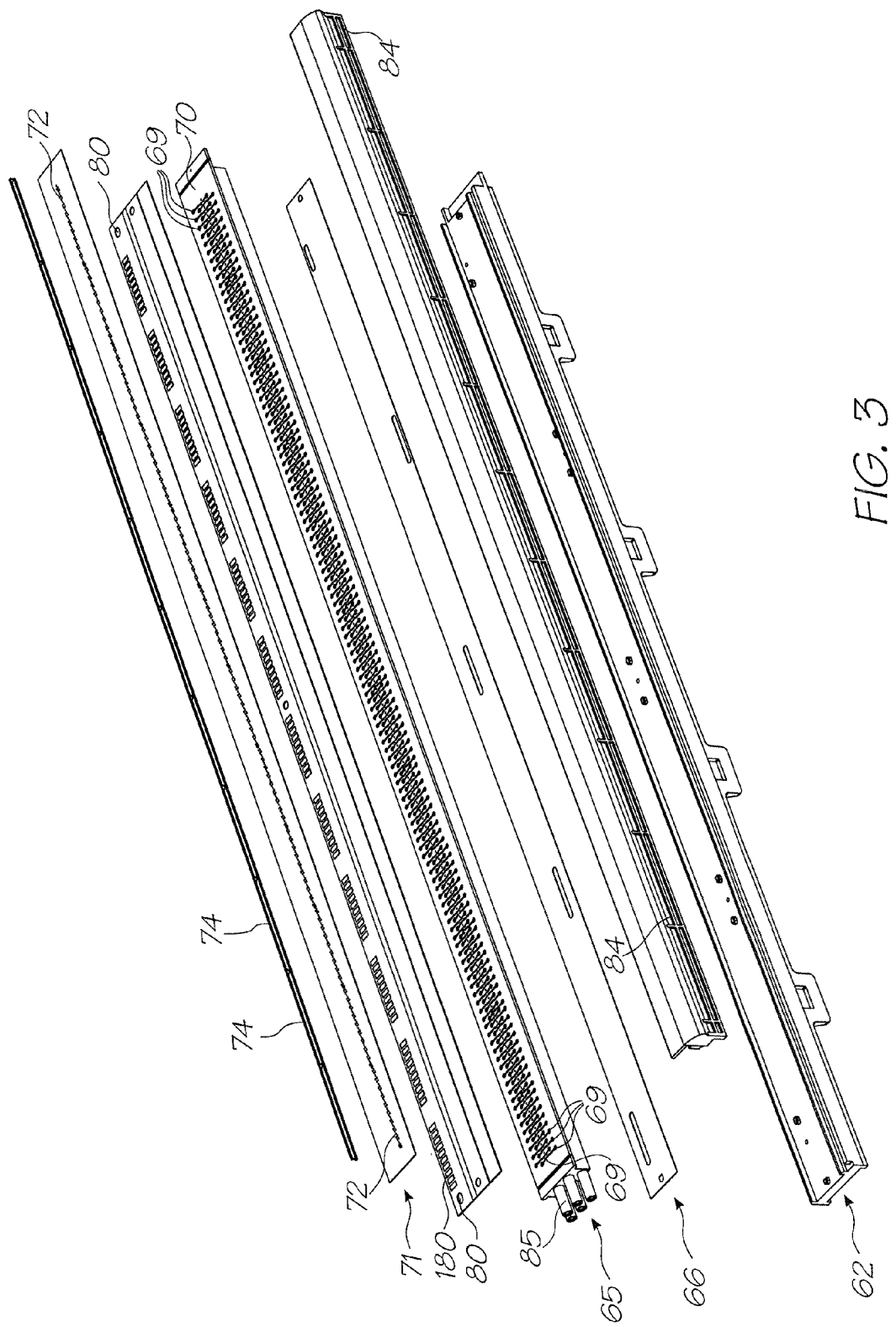
FIG. 3 is an exploded rear perspective view the printhead assembly shown in FIG. 1.
Figure 4:
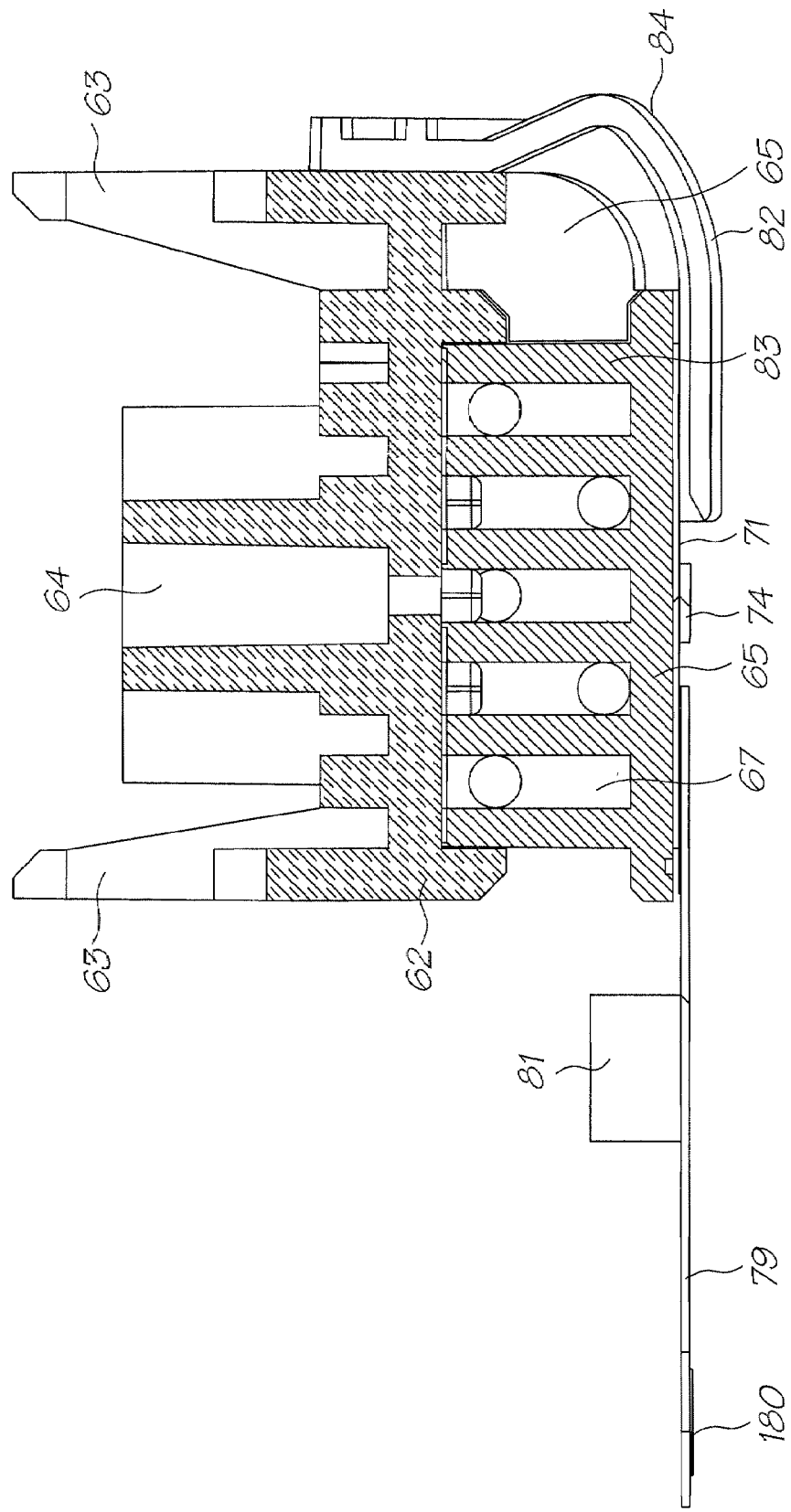
FIG. 4 is a side-sectional view of the printhead assembly shown in FIG. 1.
Figure 5:
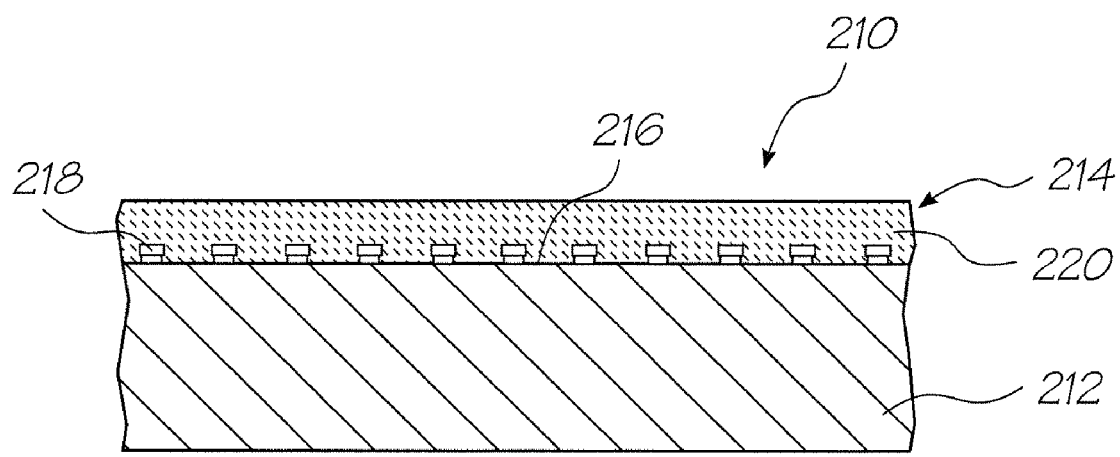
FIG. 5 shows a wafer assembly having a plurality of nozzles protected by a protective layer.

Referring to FIG. 4, the printhead ICs 74 are mounted to the underside of the lower member 65 by a polymer sealing film 71. This film may be a thermoplastic film such as a PET or polysulphone film, or it may be in the form of a thermoset film, such as those manufactured by AL technologies and Rogers Corporation. The polymer sealing film 71 is a laminate with adhesive layers on both sides of a central web, and laminated onto the underside of the lower member 65. As shown in FIG. 3, a plurality of holes 72 are laser drilled through the adhesive film 71 to coincide with the centrally disposed ink delivery points (the middle row of holes 69 and the ends of the conduits 70) for fluid communication between the printhead ICs 74 and the channels 67.

The printhead ICs 74 are arranged to extend horizontally across the width of the printhead assembly 22. To achieve this, individual printhead ICs 74 are linked together in abutting arrangement to form a printhead 56 across the surface of the adhesive layer 71, as shown in FIGS. 2 and 3.

As described in the Applicant's Applicant's earlier U.S. application Ser. No. 11/014,732 filed on Dec. 12, 2004, the printhead ICs 74 may be attached to the polymer sealing film 71 by heating the ICs above the melting point of the adhesive layer and then pressing them into the sealing film 71. Alternatively, the adhesive layer under each IC may be melted with a laser before pressing them into the film. Another option is to heat both the IC (not above the adhesive melting point) and the adhesive layer, before pressing the IC into the film 71. As alluded to above, this method of printhead fabrication has inherent alignment problems.

Following attachment and alignment of each of the printhead ICs 74 to the surface of the polymer sealing film 71, a flex PCB 79 (see FIG. 4) is attached along an edge of the ICs 74 so that control signals and power can be supplied to the bond pads on the ICs and control and operate inkjet nozzles. As shown more clearly in FIG. 1, the flex PCB 79 folds around the printhead assembly 22.

The flex PCB 79 may also have a plurality of decoupling capacitors 81 arranged along its length for controlling the power and data signals received. As best shown in FIG. 2, the flex PCB 79 has a plurality of electrical contacts 180 formed along its length for receiving power and/or data signals from control circuitry of the printer. A plurality of holes 80 are also formed along the distal edge of the flex PCB 79 which provide a means for attaching the flex PCB to complementary connectors in the printer.

As shown in FIG. 4, a media shield 82 protects the printhead ICs 74 from damage which may occur due to contact with the passing media. The media shield 82 is attached to the upper member 62 upstream of the printhead ICs 74 via an appropriate clip-lock arrangement or via an adhesive. When attached in this manner, the printhead ICs 74 sit below the surface of the media shield 82, out of the path of the passing media.

Backside MEMS Processing Described in U.S. Pat. No. 6,846,692

FIGS. 5 to 14 outline typical backside MEMS processing steps, as described in U.S. Pat. No. 6,846,692 (the contents of which is herein incorporated by reference), for fabrication of the printhead ICs 74. In an initial step, illustrated at 210 in FIG. 5, a silicon wafer 212 is provided having a frontside 216 on which is formed a plurality of MEMS nozzle assemblies 218 in a MEMS layer 214. The MEMS nozzle assemblies 218 typically comprise a sacrificial material, which fills nozzle chambers.

A protective layer 220 is interposed between the nozzle assemblies 218. This protective layer 220 is typically a relatively thick layer (e.g. 1 to 10 microns) of sacrificial material, such as photoresist, which is spun onto the frontside 216 after fabrication of the MEMS nozzle assemblies 218. The photoresist is UV cured and/or hardbaked to provide a rigid and durable protective coating that is suitable for attachment to a glass handle wafer.

Figure 6:
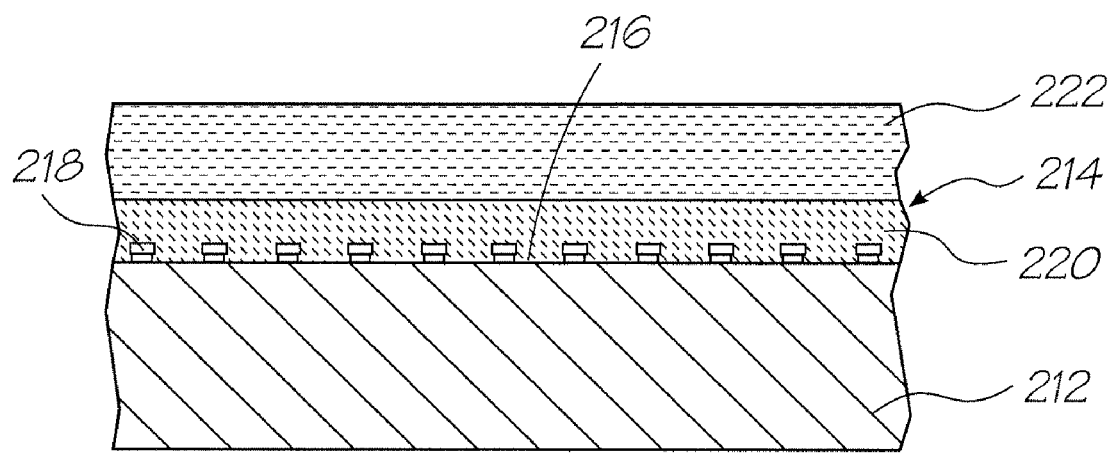
FIG. 6 shows the wafer assembly of FIG. 5 after attachment of an adhesive tape to the protective layer.

A first holding means, in the form of an adhesive tape 222, is bonded to the MEMS layer 14 as illustrated in FIG. 6. The tape 222 is bonded to the layer 214 by means of a curable adhesive. The adhesive is curable in the sense that it loses its adhesive properties or "tackiness" when exposed to ultraviolet (UV) light or heat. The tape 222 described in the specific embodiment herein is a UV-release tape, although it will be appreciated that thermal-release tapes are equally suitable for use as the first holding means.

Figure 7:
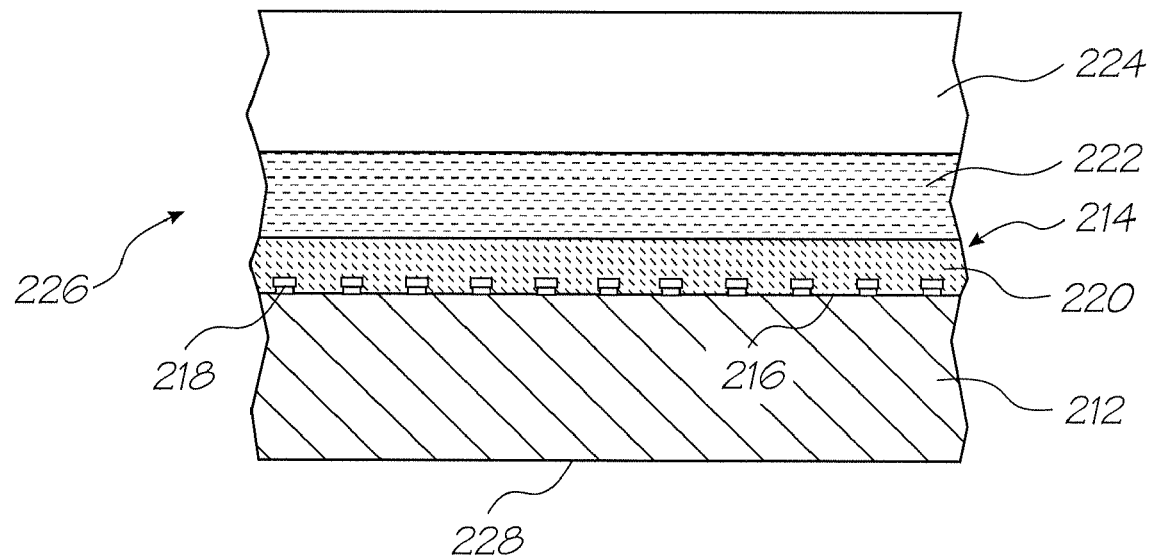
FIG. 7 shows the wafer assembly of FIG. 6 after attachment of a handle wafer to the adhesive tape.

As shown in FIG. 7, a first handle wafer 224, in the form of a glass, quartz, alumina or other handle wafer, is secured to the tape 222.

A laminate 226, comprising the silicon wafer 212 with MEMS layer 214, the tape 222 and the glass wafer 224 is then turned over to expose an opposed backside 228 of the wafer.

Figure 8:
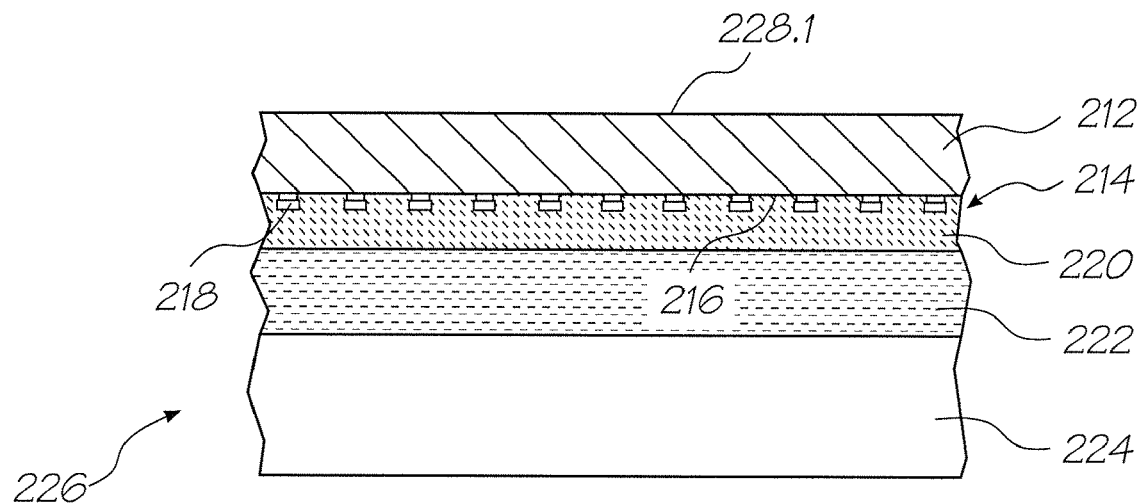
FIG. 8 shows the wafer assembly of FIG. 7 flipped for backside processing.

The backside 228 of the silicon wafer 212 is then thinned by backgrinding a surface 228.1, as illustrated in FIG. 8. Wafer thinning may include plasma thinning to remove any surface cracks or indentations resulting from backgrinding.

Figure 9:
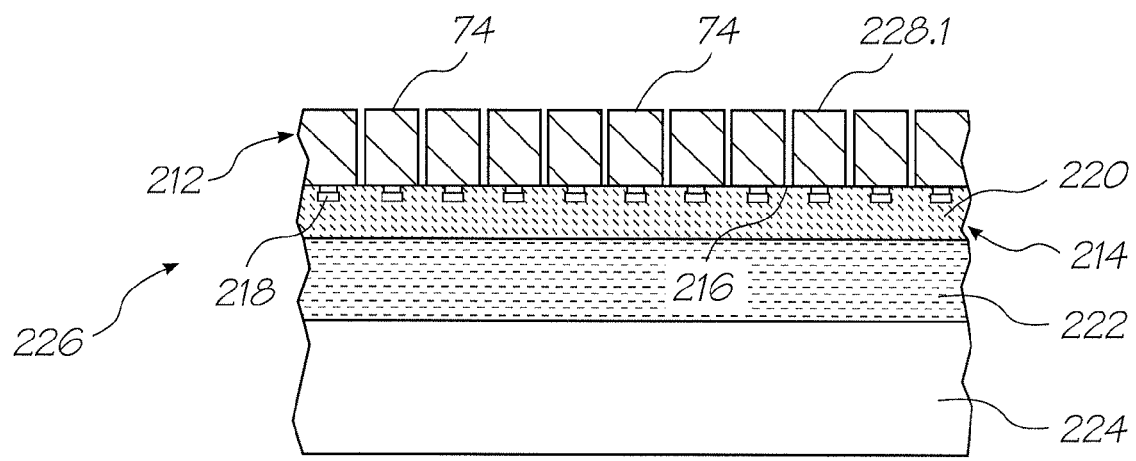
FIG. 9 shows the wafer assembly of FIG. 8 after backside processing, which includes defining dicing streets in the wafer.

Then, as shown in FIG. 9, the silicon wafer 212 is deep silicon etched through the wafer from the backside 228 to dice the wafer 212 and form individual integrated circuits 74. In FIG. 9, each IC 74 has only one MEMS nozzle assembly 218 associated therewith, although it will be appreciated that each IC typically contains an array (e.g. greater than 2000) nozzle assemblies arranged in rows.

At the same time as etching dicing streets from the backside 228 of the wafer 212, ink supply channels may also be etched so as to provide a fluidic connection to each nozzle assembly 218.

Figure 10:
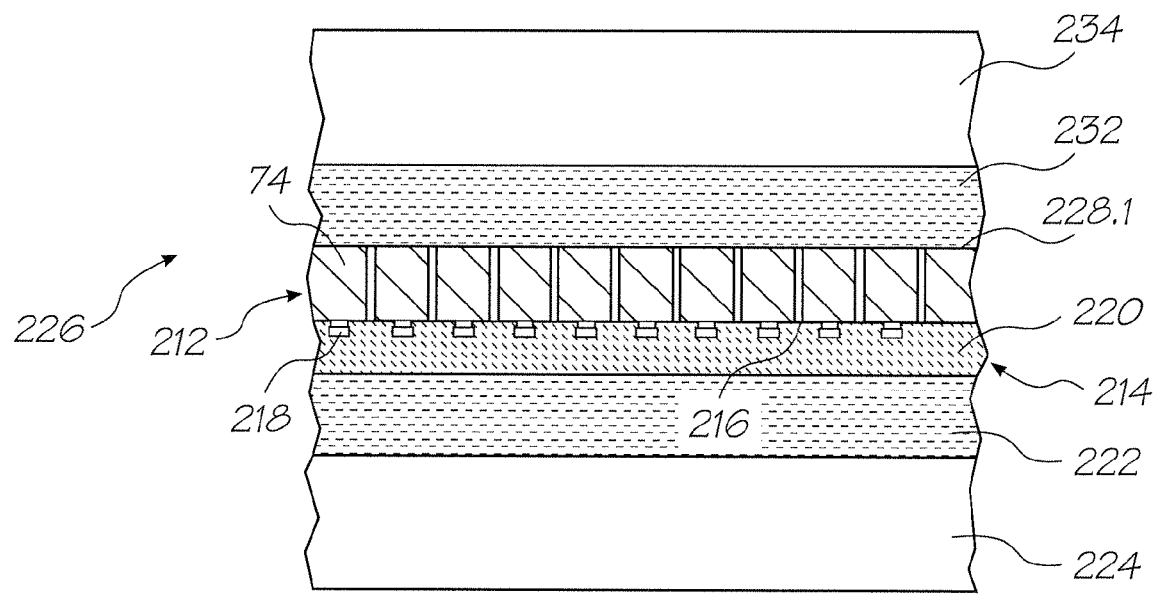
FIG. 10 shows the wafer assembly of FIG. 9 after attachment of a backside handle wafer using an adhesive tape.

Following backside etching, and as shown in FIG. 10, a second holding means in the form of a second adhesive tape 232 (e.g. UV-release tape or thermal-release tape) is bonded to the backside surface 228.1 of the wafer 212, and a second handle wafer 234 is bonded to the tape 232.

Figure 11:
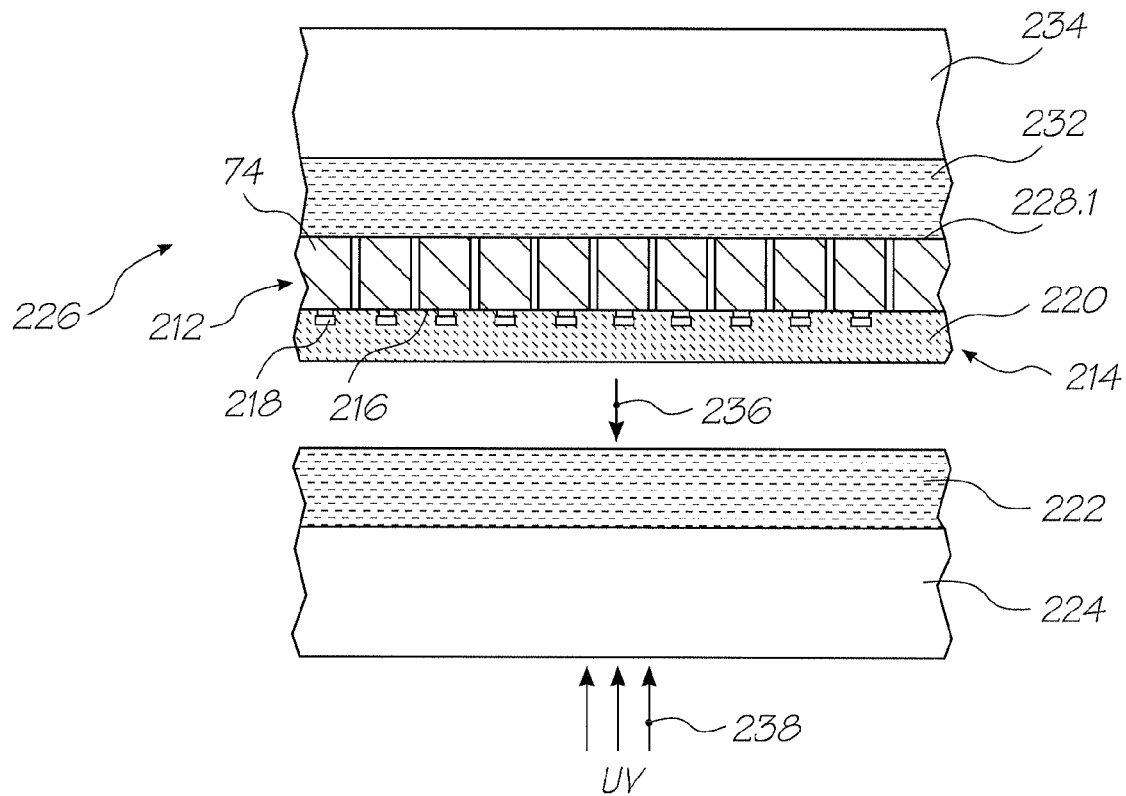
FIG. 11 shows the wafer assembly of FIG. 10 after releasing the frontside handle wafer and tape.

After attachment of the second handle wafer 234, the first tape 222 and the glass wafer 224 are removed, as illustrated schematically by arrow 236 in FIG. 11. The tape 222 may be removed by exposing it to UV light which is projected on to the tape 222 through the glass layer 224 as illustrated by arrows 238. It will be appreciated that the glass wafer 224 is transparent to the UV light. In contrast, the silicon wafer 212 is opaque to the UV light so that the tape 232 on the other side of the wafer 212 is not affected by the UV light when the tape 222 is exposed to the UV light.

Figure 12:
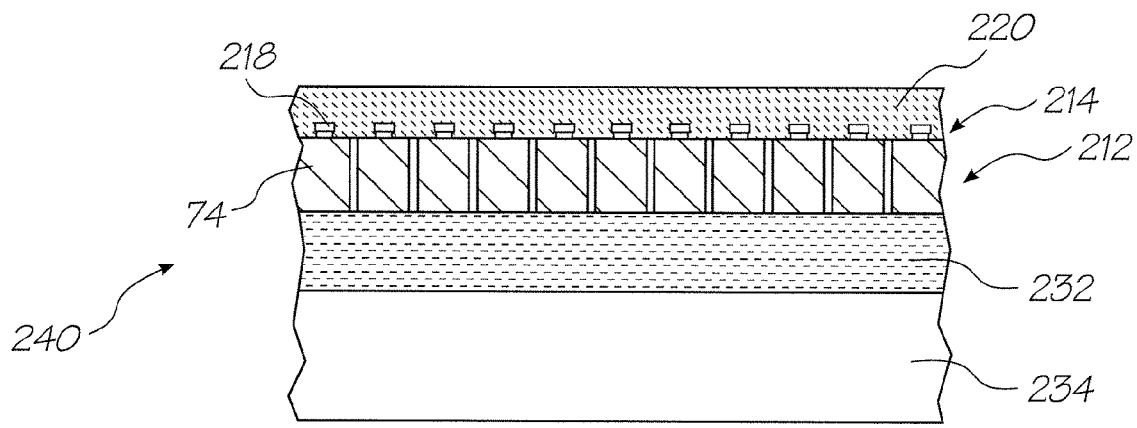
FIG. 12 shows the wafer assembly of FIG. 11 flipped.

Referring to FIG. 12, once the tape 222 and glass wafer 224 have been removed, a new laminate 240, comprising the silicon wafer with MEMS layer 214, the second tape 232 and the glass wafer 234 is turned over to expose the protective layer 220.

Figure 13:
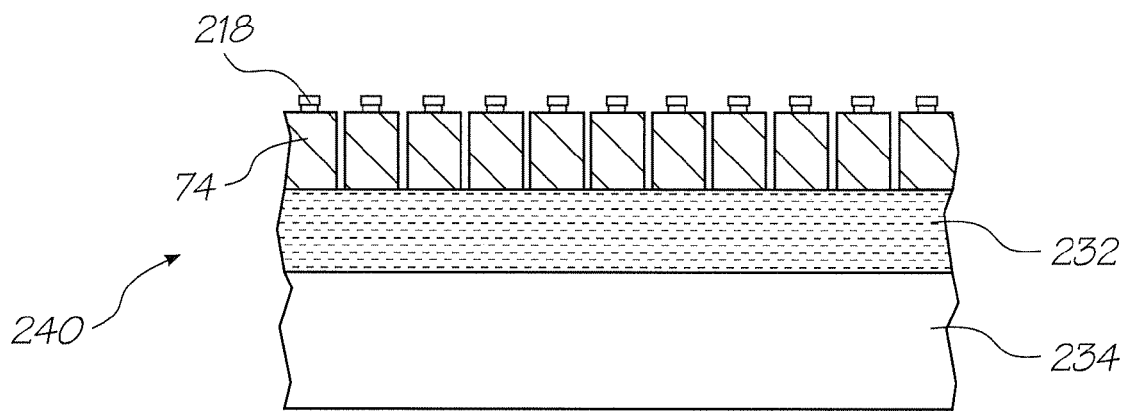
FIG. 13 shows the wafer assembly of FIG. 12 after ashing the protective layer.

Referring to FIG. 13, the protective layer 220 is then removed by ashing in an oxygen plasma. This releases the MEMS nozzle assemblies 218, and completes the separation of the ICs 74. At the same time as removing the protective layer 220, any other exposed sacrificial material, which remained from frontside MEMS fabrication, is also removed.

Figure 14:
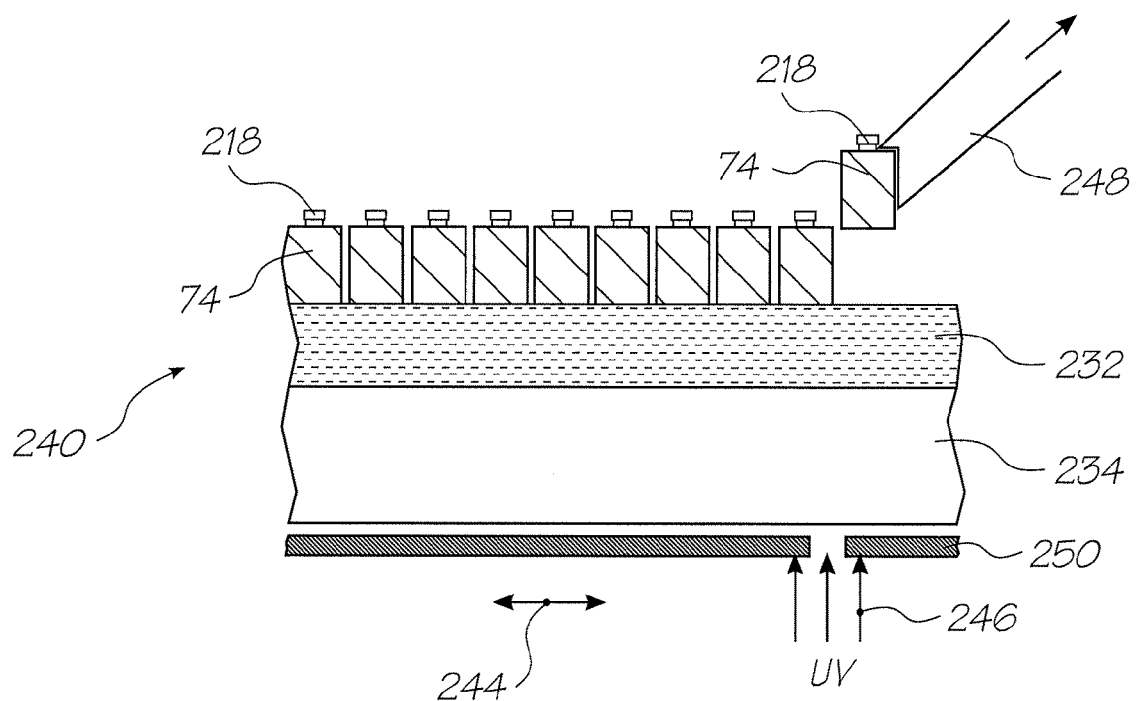
FIG. 14 shows the wafer assembly of FIG. 13 with individual chips being removed.

The laminate 240 is then placed on an xy wafer stage (not shown) which is reciprocated, as illustrated by arrow 244 in FIG. 14. Each IC 74, when it is desired to remove it, is exposed to UV light as indicated by arrows 246 through a mask 250. This cures the adhesive of the tape 232 locally beneath one particular IC 74 at a time, to enable that IC to be removed from the tape 232 by means of a transporting means which may include a vacuum pickup 248. The printhead ICs 74 can then be packaged and/or formed into a printhead by butting a plurality of ICs together.

Alternative Backside MEMS Processing and Printhead Construction

A shortcoming of the backside MEMS process described above is that the printhead ICs 74 must be individually removed from the second handle wafer 234 and then assembled into the printhead 56 by attaching them to an intermediary substrate, such as the adhesive film 71. This process has inherent alignment difficulties.

FIGS. 15 to 19 show an alternative sequence of backside MEMS processing steps, which avoids picking ICs 74 individually from the second handle wafer 234, as shown in FIG. 14. Instead the ICs 74 are bonded directly onto an intermediary substrate 302 from a wafer film frame 300, as will be described in more detail below.

Figure 15:
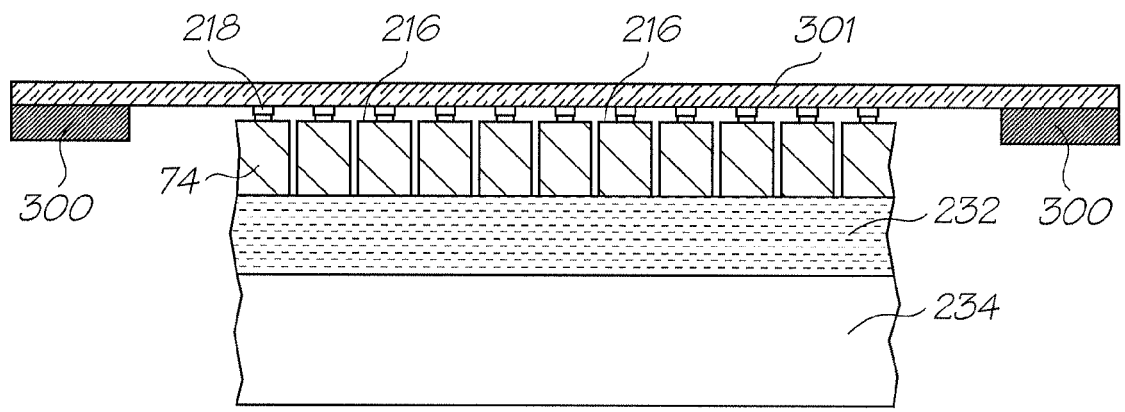
FIG. 15 shows the wafer assembly of FIG. 13 attached mounted to a wafer film frame.

Starting from the assembly 240 shown in FIG. 13, the array of printhead ICs 74 attached to the second handle wafer 234 is mounted to a wafer film frame 300, as shown in FIG. 15. The frontside 216 of each printhead IC 74 is attached to a film frame tape 301 supported by the wafer film frame 300. Whilst the size of the MEMS devices 218 is shown exaggerated in FIG. 15, it will be appreciated that the printhead ICs 74 have a substantially planar frontside 216 which bonds to the film frame tape 301.

It is important that the first tape 222 and second tape 232 are complementary with the film frame tape 301 supported by the wafer film frame 300. Accordingly, in this embodiment it is preferred that the first tape 222 and second tape 232 are thermal-release tapes (e.g. 150° C. thermal release tape and 170° C. thermal release tape), and the film frame tape 301 is a UV-release tape. Thus, the array of printhead ICs 74 can be mounted to the film frame tape 301 and then the second handle wafer 234 with second tape 232 removed from the array by heating.

Figure 16:
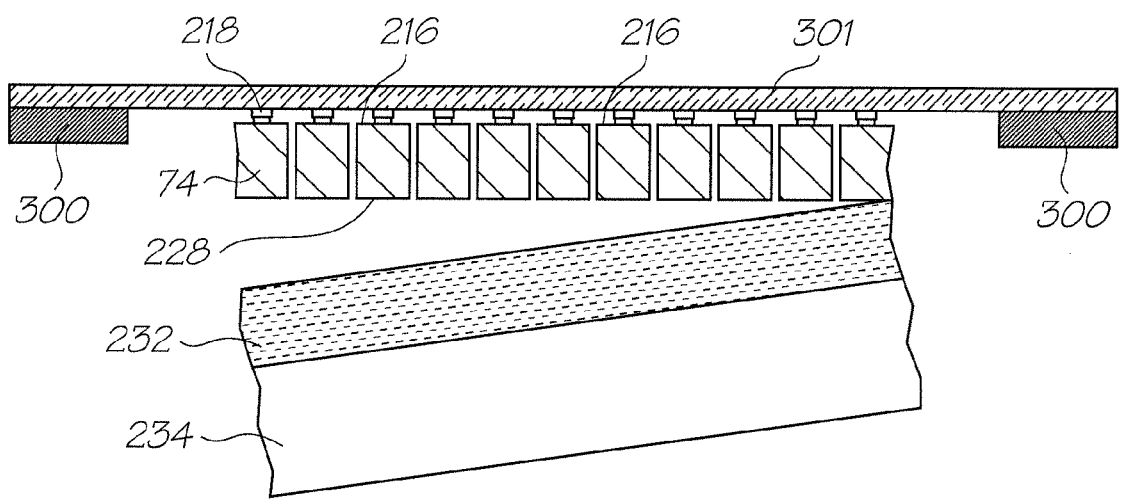
FIG. 16 shows the assembly of FIG. 15 with the second handle wafer and tape partially removed.

Referring to FIG. 16, there is shown the second handle wafer 234 (together with second tape 232) being removed from the backside 228 of the array of ICs 74. This may be achieved by simply heating the thermal-release tape 232. After this step, the printhead ICs 74 are mounted via their frontsides 216 to the film frame tape 301. The backsides 228 of the printhead ICs 74, which will be attached to the LCP member 65, are exposed and ready for bonding.

After removal of the second handle wafer 234 and tape 232, the exposed backsides 228 of the ICs may be treated for subsequent bonding. For example, the backsides 228 may be treated for bonding using the proprietary Zibond™ process, developed by Ziptronix, Inc. This process typically requires an oxide surface to be treated with liquid ammonia, which prepares the surface for bonding to a range of substrates. The backsides 228 of the ICs 74 may be coated with a layer of oxide at an earlier stage of backside MEMS processing (for example, at the stage shown in FIG. 8—that is, prior to etching backside dicing streets and ink supply channels). Ammonia treatment of this backside oxide layer may then be performed with the ICs 74 mounted on the wafer film frame 300. The present invention is particularly suited for the Zibond™ bonding process, because there is minimal handling of the ICs 74 between backside treatment and subsequent bonding.

Alternatively, the backsides 228 of the ICs 74 may be left untreated and bonded to an intermediary substrate, such as the adhesive film 71, using more conventional adhesive bonding methods.

Figure 17:
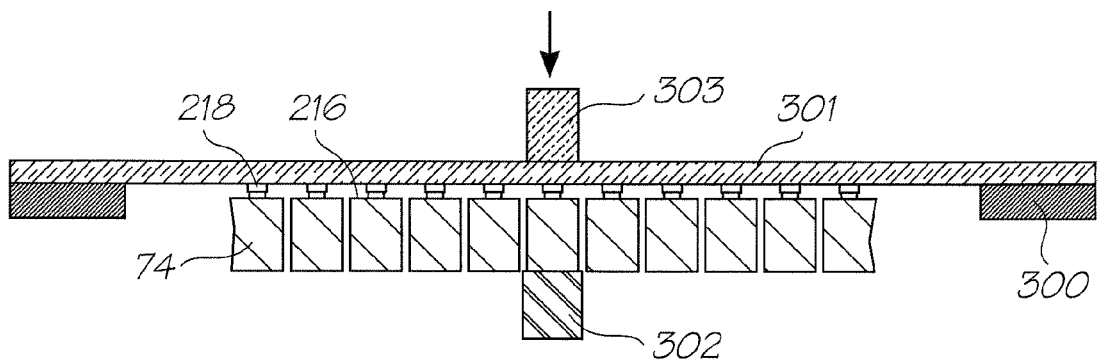
FIG. 17 shows a printhead integrated circuit being bonded to an intermediary substrate.
Figure 18:
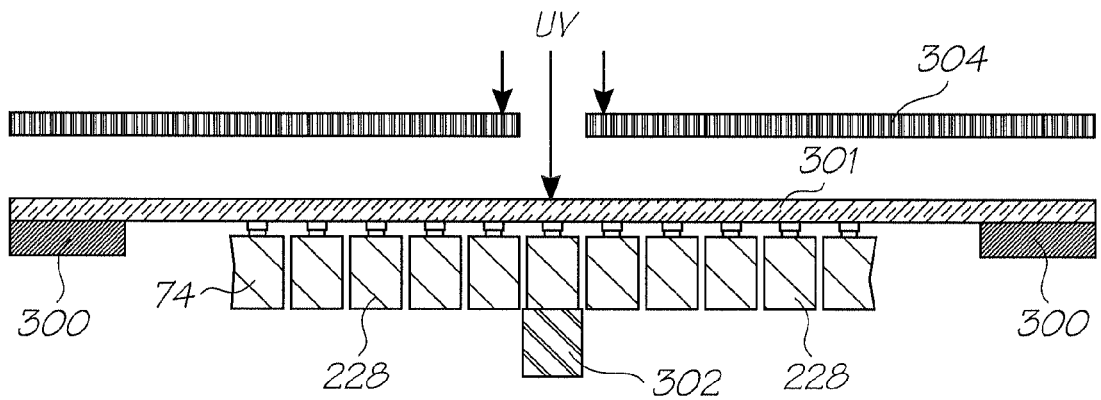
FIG. 18 shows a bonded printhead integrated circuit being detached from a film frame tape.
Figure 19:
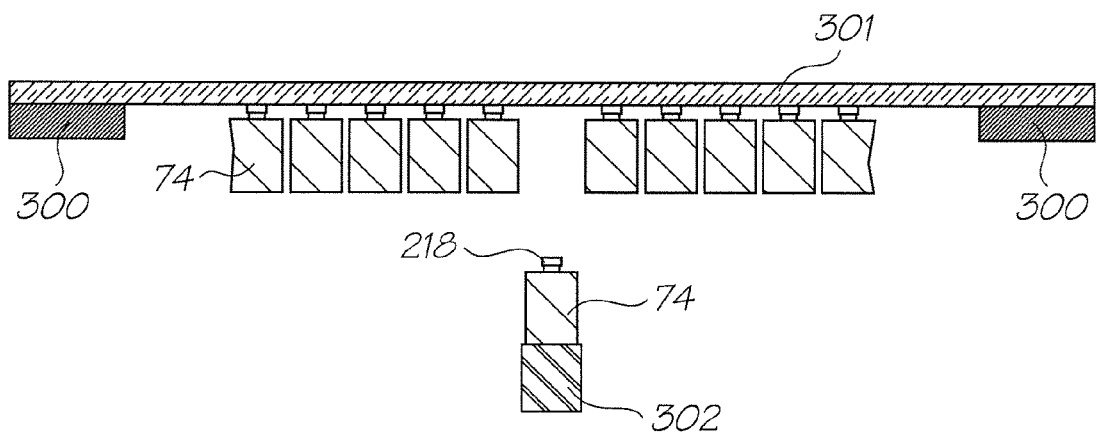
FIG. 19 shows the bonded printhead integrated circuit separated from the wafer film frame.

The principal advantages of the present invention are realized by the sequence of steps represented by FIGS. 17 to 19. Instead of removing the ICs 74 from the wafer film frame 300, the backsides 228 are bonded directly to an intermediary substrate 302, whilst still attached to the film frame tape 301. A bonding tool 303 may be employed to select and bond an individual IC 74 onto a predetermined position of the intermediary substrate 302, as shown in FIG. 17. The use of the bonding tool 303 in combination with the wafer film frame 300 ensures high-precision bonding of individual printhead ICs 74 to the intermediary substrate 302.

The intermediary substrate 302 may be the laser-drilled adhesive film 71 described earlier. Alternatively, the intermediary substrate 302 may be a rigid, glass member, which takes the place of the adhesive film 71 in bonding the printhead ICs 74 to the LCP member 65. A glass member is advantageous, because it has a similar coefficient of thermal expansion to the LCP member 65 and the printhead ICs 74. The skilled person will appreciate that the glass member may be pre-etched with ink supply holes corresponding to the laser-drilled holes 72 of the polymer film 71.

Hence, it will be appreciated that the present invention improves alignment of the printhead ICs 74 with the intermediary substrate 302. Alignment is improved firstly by performing the bonding step with the printhead ICs 74 still mounted on the wafer film frame 300. Secondly, the present invention facilitates the use of intermediary substrates 302 other than the polymeric adhesive film 71 described earlier. In avoiding the use of the polymeric adhesive film 71, alignment errors resulting from differential thermal expansion are further minimized.

Once the printhead IC 74 is bonded to the intermediary substrate 302, the bonding tool is removed and the bonded IC 74 detached from the film frame tape 301. As shown in FIG. 18, this may achieved by selectively UV-curing a zone of the tape 301. A suitable mask 304 may be employed for selective UV-curing.

Finally, as shown in FIG. 19, the intermediary substrate 302 with the IC 74 bonded thereto is separated fully from the wafer film frame 300. The bonding process illustrated in FIGS. 17 to 19 may be repeated along the length of the intermediary substrate 302 so as to build up the printhead 56 from a plurality of abutting printhead ICs 74.

Once the printhead 56 is fully constructed, an opposite face of the intermediary substrate 302 is attached to the LCP member 65, as described above, to form the printhead assembly 22.

It will be appreciated by ordinary workers in this field that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method of bonding an integrated circuit to an adhesive substrate, said method comprising the steps of:
    (a) providing a film frame tape supported by a wafer film frame, said film frame tape having a plurality of integrated circuits releasably attached via respective frontsides to said film frame tape;
    (b) positioning said adhesive substrate at a backside of one individual integrated circuit;
    (c) positioning a bonding tool on a zone of said film frame tape, said zone being aligned with said individual integrated circuit; and
    (d) applying a bonding force from said bonding tool, through said film frame tape and said individual integrated circuit, onto said adhesive substrate, thereby bonding said backside of said individual integrated circuit to said adhesive substrate.

2. The method of claim 1, further comprising the step of: removing said bonding tool from said tape.

3. The method of claim 1, wherein said film frame tape is a UV-release tape.

4. The method of claim 2, further comprising the step of: exposing said zone of said film frame tape to UV radiation and releasing said bonded integrated circuit from said tape.

5. The method of claim 1, wherein said integrated circuit is a MEMS integrated circuit.

6. The method of claim 1, wherein said integrated circuit is a printhead integrated circuit.

7. The method of claim 6, wherein steps (b) to (d) are repeated so as to construct a printhead on said substrate, said printhead comprising a plurality of abutting printhead integrated circuits.

8. The method of claim 6, wherein said substrate has a plurality of ink supply holes defined therein, wherein one or more of said holes are aligned with ink supply channels defined in the backside of said printhead integrated circuit.

9. The method of claim 1, wherein said substrate is an intermediary substrate for attachment of said printhead integrated circuit to an ink supply manifold.

10. The method of claim 9, wherein said intermediary substrate is an adhesive polymer film.

11. The method of claim 9, wherein said intermediary substrate is a rigid member having a coefficient of thermal expansion within about 20% of the coefficient of thermal expansion of the printhead integrated circuit and/or the ink supply manifold.

12. The method of claim 9, wherein said intermediary substrate is a glass member.

13. The method of claim 9, wherein a backside of each of the plurality of integrated circuits is pre-treated for bonding to said intermediary substrate.

14. The method of claim 13, wherein said backside comprises an oxide layer.

15. The method of claim 13, wherein said oxide layer is pre-treated with liquid ammonia.

16. A method of constructing a printhead using a plurality of printhead integrated circuits, said method comprising the steps of:
    (a) providing a film frame tape supported by a wafer film frame, said film frame tape having a plurality of printhead integrated circuits releasably attached via respective frontsides to said film frame tape;
    (b) positioning an adhesive substrate at a backside of one of said printhead integrated circuits;
    (c) positioning a bonding tool on a zone of said film frame tape, said zone being aligned with said printhead integrated circuit;
    (d) applying a bonding force from said bonding tool, through said film frame tape and said printhead integrated circuit, onto said adhesive substrate, thereby bonding said backside of said printhead integrated circuit to said adhesive substrate;
    (e) repeating steps (b) to (d) so as to construct a printhead on said substrate, wherein said printhead comprises a predetermined number of abutting printhead integrated circuits.

17. The method of claim 16, wherein said adhesive substrate comprises a plurality of ink supply holes defined therein, each of said holes being aligned with an ink supply channel defined in the backside of said printhead.

18. The method of claim 17, wherein said adhesive substrate is a glass member.

19. The method of claim 16, further comprising the step of: bonding said adhesive substrate to an ink supply manifold such that said substrate is sandwiched between said printhead and said ink supply manifold.

20. The method of claim 16, wherein said printhead is a pagewidth inkjet printhead.

* * * * *